United States Patent [19]
Kempka et al.

[11] Patent Number: 5,531,236
[45] Date of Patent: Jul. 2, 1996

[54] DIRECTED FLOW FLUID RINSE TROUGH

[76] Inventors: Steven N. Kempka, 9504 Lona La., Albuquerque, N.M. 87111; Robert N. Walters, 11872 LaGrange St., Boise, Id. 83709

[21] Appl. No.: 420,175

[22] Filed: Apr. 11, 1995

Related U.S. Application Data

[63] Continuation of Ser. No. 251,984, Jun. 1, 1994, abandoned.

[51] Int. Cl.⁶ .......................................................... B08B 3/04
[52] U.S. Cl. ........................................... 134/182; 134/902
[58] Field of Search ............................ 134/902, 61, 155, 134/159, 182, 183, 184, 186; 118/500; 354/326, 337

[56] References Cited

U.S. PATENT DOCUMENTS

| | | | |
|---|---|---|---|
| 4,526,185 | 7/1985 | Fukuda | 134/159 |
| 5,191,908 | 3/1993 | Hiroe et al. | 134/902 X |

FOREIGN PATENT DOCUMENTS

| | | | |
|---|---|---|---|
| 266431 | 11/1991 | Japan | 134/902 |
| 152522 | 5/1992 | Japan | 134/902 |
| 136116 | 6/1993 | Japan | 134/902 |

*Primary Examiner*—Philip R. Coe
*Attorney, Agent, or Firm*—Gregory A. Cone

[57] ABSTRACT

Novel rinse troughs accomplish thorough uniform rinsing. The tanks are suitable for one or more essentially planar items having substantially the same shape. The troughs ensure that each surface is rinsed uniformly. The new troughs also require less rinse fluid to accomplish a thorough rinse than prior art troughs.

15 Claims, 4 Drawing Sheets

DIRECTED FLOW FLUID RINSE TROUGH

This invention was made with Government support under Contract DE-AC04-94AL85000 awarded by the U.S. Department of Energy. The Goverment has certain rights in the invention.

This is a continuation of U.S. Ser. No. 08/251,984 filed Jun. 1, 1994, and now abandoned.

BACKGROUND OF THE INVENTION

The removal of contaminants from surfaces is a common task. A common techique used to accomplish this removal is to rinse the surface with air, water, or some other fluid. Differing applications have different constraints on the type of rinsing fluid employed, the flows that are need to accomplish the rinse, and the thoroughess of rinse required.

The rinsing of essentially planar items is one common example of rinsing. In production environments, often many items of similar size and shape must be rinsed. Examples of such environments include semiconductor wafer processing, photographic film processing, and certain precision machined parts. Semiconductor wafer processing poses a particular challenge: large numbers of wafers must be rinsed, the rinse must be very thorough, and the hazardous nature of the contaminants being removed imply that the rinse be accomplished with a minimum of fluid (since the waste fluid carries the contaminants).

Several techniques are currently employed in the rinsing of semiconductor wafers. McConnell, et. al. in U.S. Pat. No. 4,795,497 disclose a fluid treatment system that is kept hydraulically full. Processing fluids can be pumped through the system as well as rinsing fluids. This system proves cumbersome, however, for the rinsing of semiconductor wafers processed by other methods.

Another common method of rinsing semiconductors involves a rinse tank. The wafers are held in a rectangular trough, and the loaded trough is lowered into a tank of deionized water. This approach is straightforward in concept and in implementation, and is applicable in a variety processing systems. This rinsing process, however, does not result in uniformly thorough contaminant removal from the wafers. It also requires excessive quantities of costly deionized water, and results in equally excessive amounts of contaminated water. There is an unmet need for a rinsing system which is efficiently designed to minimize the amounts of rinse fluids used by providing for fairly uniform removal of contaminants from wafer surfaces.

SUMMARY OF THE INVENTION

An object of the present invention is to provide for uniform rinsing of substantially planar items.

Another object of the present invention is provide for effective rinsing using a minimum amount of rinsing fluid.

A further object is to provide a rinsing apparatus that can efficiently rinse semiconductor wafers, providing uniform rinsing of contaminants and requiting minimum rinse fluid.

Another object is to provide a rinsing apparatus that tailors the rinse fluid flow velocity fields for uniform, thorough rinsing.

Additional objects, advantages, and novel features will become apparent to those skilled in the art upon examination of the following description or may be learned by practice of the invention. The objects and advantages of the invention may be realized and attained by means of the instrumentalities and combinations particularly pointed out in the appended claims.

Removal of contaminants from the surface of an object depends strongly on the rinsing fluid's velocity field. The effectiveness of both mechanical and diffusive removal depends on the fluid velocity field. Flow rates over the objects must be high for effective rinsing. The flow rates must also be as uniform as possible to ensure that all surfaces are equally well rinsed.

In one embodiment of the invention the bottom of a rinsing trough is shaped to conform to the lower perimeter shape of the objects to be rinsed. The rinsing fluid, flowing from the bottom of the trough to the top, is thus encouraged to flow over the surfaces of the objects rather than around the objects' sides. This results in higher flow rates from a given amount of rinse fluid.

In another embodiment of the invention the space between the end walls of a rinsing trough and the nearest object is made smaller than that between any adjacent objects. This encourages the fluid flow over the surface of the end objects to be approximately the same as the flow between adjacent objects, providing a more thorough and even rinse.

In a further embodiment the end walls of a rinsing trough are extended beyond the side walls. As the fluid flows from the bottom of the trough to the top, all the fluid must flow over the side walls since the end walls extend beyond the side walls. This results in a more even flow distribution by preventing excess fluid from escaping over the end walls.

Further embodiments are described that disclose specific methods of choosing suitable dimensions and materials for specific applications.

DESCRIPTION OF THE FIGURES

The accompanying drawings, which are incorporated into and form part of the specification, illustrate an embodiment of the invention and, together with the description, serve to explain the principles of the invention.

DETAILED DESCRIPTION OF THE INVENTION

Removal of contaminants from a surface depends strongly on the characteristics of the rinse fluid's velocity field. Convective removal occurs when a finite thickness of contaminant lies on the surface. For semiconductor rinsing, this means a thickness greater than approximately $10^{12}$ contaminant molecules. The contaminant is sheared off the surface due to the stress field of the water. The shear stress in a Newtonian fluid such as water is $$\mu(\delta u_i/\delta x_j + \delta u_j/\delta x_i)$$

where $\mu$ is the fluid viscosity, $u_i$ is the $i^{th}$ component of the fluid velocity, $x_j$ is the coordinate in the $j^{th}$ direction (summing for all j). Thus the velocity field of the water is important in convective removal of finite thickness layers of contaminant.

Convective-diffusive removal of a contaminant with concentration c occurs at a rate $-\alpha \delta c/\delta n$. The diffusion coefficient of the contaminant in the rinse fluid is $\alpha$, and n is the direction perpendicular to the surface. The diffusivity $\alpha$ is a property of the contaminant in the rinse fluid, whereas the gradient of the concentration $\delta c/\delta n$ depends strongly on the velocity field of the fluid. This coupling is shown in the equation which describes the conservation of mass of the contaminant, $$\delta c/\delta t + \nabla \cdot (vc) = \alpha \nabla^2 c$$

where v is the velocity vector of the rinse fluid and $\nabla$ is the gradient operator. This equation shows that the concentration field c and hence its gradients depend on the velocity field v. Large velocity gradients associated with large flow rates result in large concentration gradients. Thus the convective-diffusive removal of contaminants depends strongly on the velocity field. In the absence of fluid motion removal is purely diffusive which is much slower. Large flow rates of the rinse fluid also ensure that once a contaminant is removed from the surface it is removed from the vicinity of the surface, avoiding redeposition on the surface.

Figure 1:
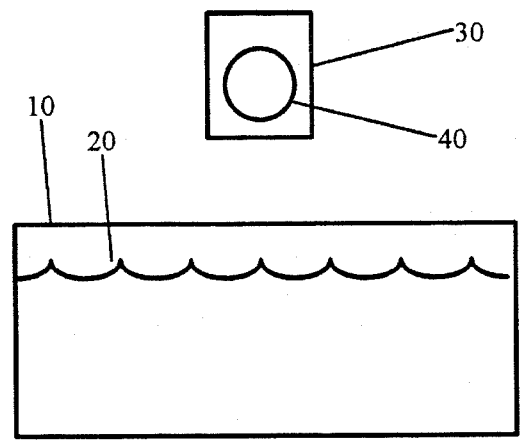
FIG. 1 shows prior art rinse trough and tank.

FIG. 1 shows a prior art rinsing method, commonly used for rinsing semiconductor wafers. The wafers 40 to be rinsed are held in a trough 30. Deionized water 20 used for rinsing is held in a tank 10. In operation the trough 30 with wafers 40 is lowered into the water 20. The water 20 flows up through the bottom of the trough 30, over the surfaces of the wafers 40, and back out over the sides and ends of the trough 30.

Figure 2:
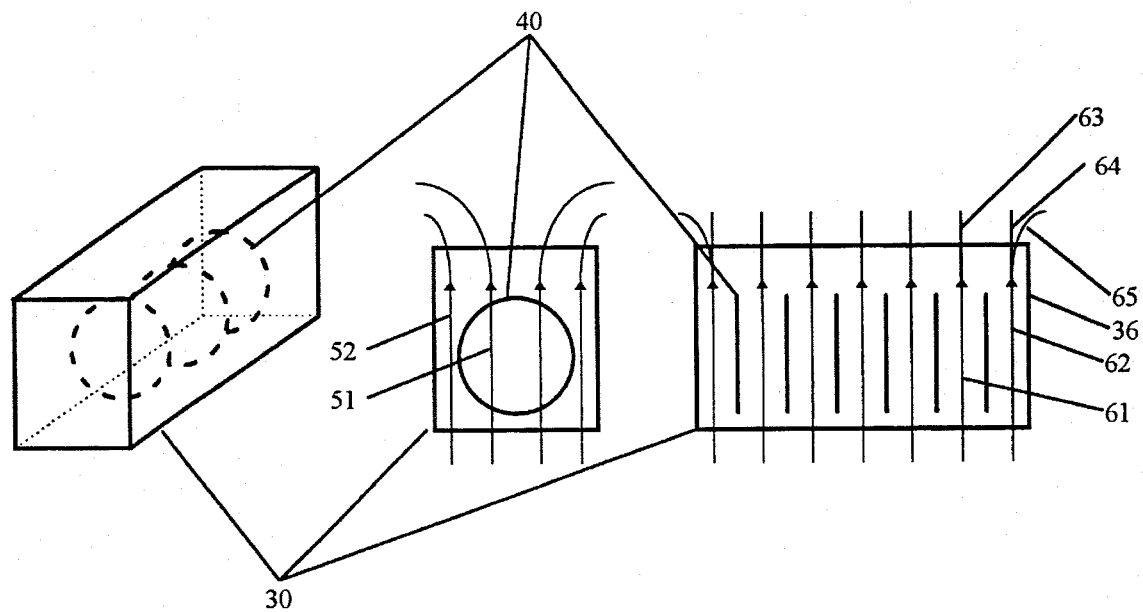
FIG. 2 is a more detailed representation of the prior art rinse trough.

A trough such as is commonly used in the previously described rinse process is shown in FIG. 2. The trough 30 is generally rectangular in cross section. The wafers 40 to be rinsed are held in the trough 30. The characteristics of the rinse fluid velocity with this prior art tank lead to deficiencies in rinsing. The rinse fluid flow is represented by flow lines 51, 52, 61, 62, 63, 64, 65. Part of the fluid flow 51 flows over the wafer surface. Part of the fluid flow 52, however, flows between the wafer and the side of the trough 30. This fluid flow 52 does not contribute effectively to the rinse process. Another deficiency arises from the fluid flow near the ends of the trough 30. The fluid flow 61 between adjacent wafers can be approximately uniform, leaving the trough by flowing 63 over the side walls of the trough 30. The flow 62 near the end walls 36 of the trough 30 can flow 64 partly over the side walls and partly 65 over the end walls. The difference in fluid flow between adjacent wafers and between wafers and the trough end walls 36 can lead to inconsistent rinsing.

Figure 3:
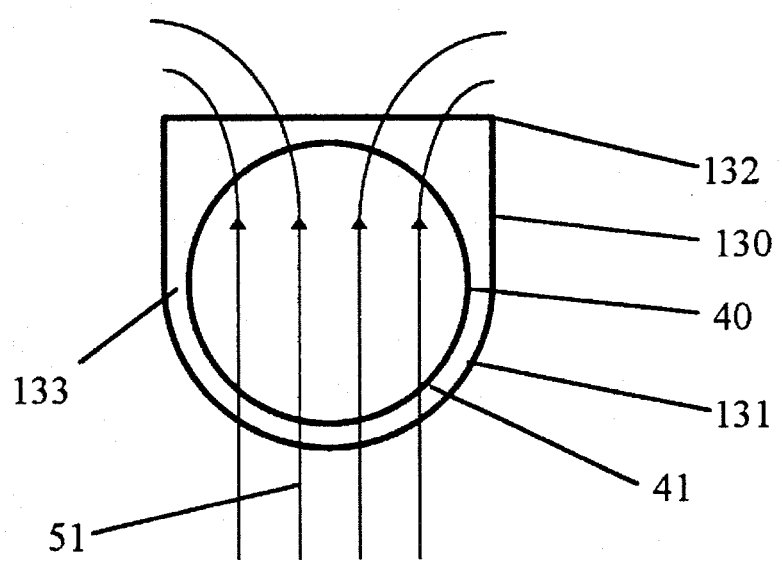
FIG. 3 is a sectional view of a rinse trough according to the present invention.

FIG. 3 shows a cross section of a rinse trough made according to the present invention. The trough 130 has a lower shape 131 that closely conforms to the lower shape 41 of the wafers. Additionally, the distance 133 between the trough side walls 132 and the wafer 40 is kept small. This shape greatly reduces the wasted fluid flow around the sides of the wafers by constraining the fluid to flow 51 primarily over the wafer surfaces and then over the side walls 132.

Figure 4:
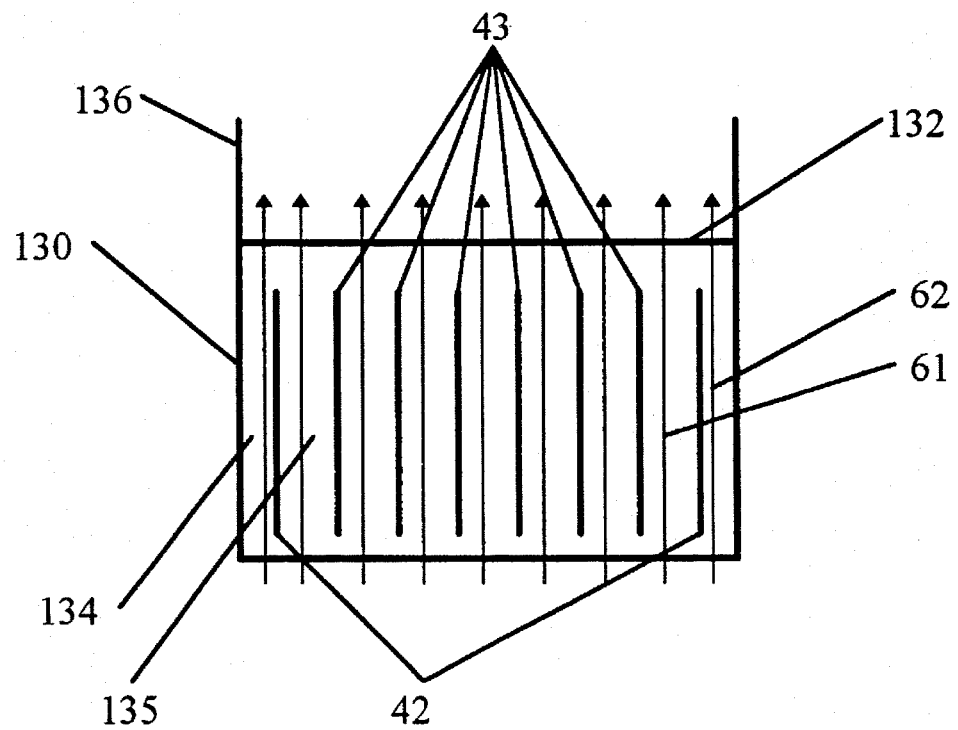
FIG. 4 is another sectional view of a rinse trough according to the present invention.

In FIG. 4 a cross section along the axis of a rinse trough according to the present invention is shown. The end walls 136 of the trough 130 extend beyond the side walls 132. Also, the distance 135 between interior wafer surfaces is different than the distance 134 between the end wafers 42 and the trough end walls 136. The rinse fluid flow 61 flows over the wafer surface and then over the side walls 132 as discussed before. The rinse fluid flow 62 between the end wafers 42 and the end walls 136 is constrained by the higher end walls 136 to flow preferentially over the side walls 132. A trough with these design characteristics will thus be able to accomplish a more uniform rinse since the fluid flow through the trough can be made more uniform.

Figure 5:
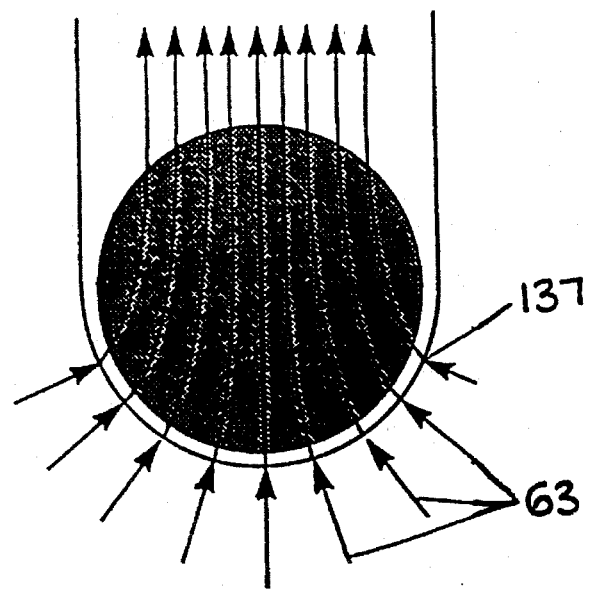
FIG. 5 is another sectional view of a rinse trough according to the present invention.

FIG. 5 shows the fluid flow through a rinse trough according to the present invention. The fluid inlets 137 are arranged so that the rinse fluid flow 63 is directed radially inward over the wafer surface. This results in an even flow velocity field over the wafer surface, ensuring that the surface of each wafer is rinsed uniformly.

Figure 6A:
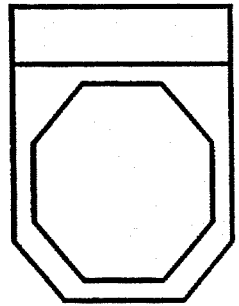
FIG. 6 shows sectional views of several variations of rinse troughs according to the present invention.
Figure 6B:
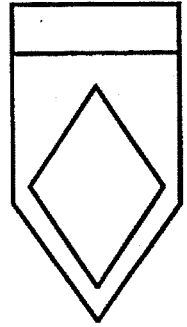
Figure 6C:
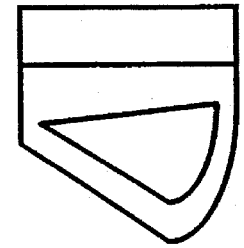

Non-circular shapes can of course be rinsed in similar fashion. FIG. 6 shows sectional views of several troughs for rinsing non-circular items. FIG. 6a shows a trough designed for octagonal items. FIG. 6b shows a trough designed for diamond shaped items. FIG. 6c shows a trough designed for items of a less regular structure. In each example, the lower portion of the trough is shaped to closely match the lower portion of the items. The gap between the items and the sidewall is kept small, and the end walls extend beyond the side walls.

Figure 7:
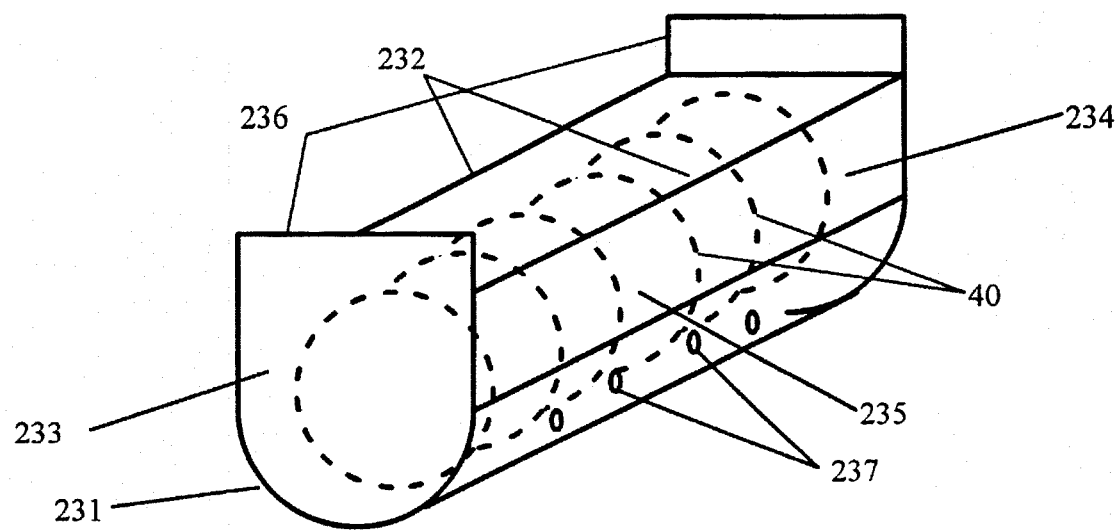
FIG. 7 shows a detailed view of another embodiment of a rinse trough according to the present invention.

FIG. 7 shows a trough according to the present invention, designed for contemporary semiconductor processing. The wafers 40 are approximately 20 cm in diameter, a common semiconductor wafer size. Semiconductor wafers are commonly processed in lots of 50 wafers, so the trough is formed so as to hold a 50 wafer lot to be rinsed together. The gap 235 between adjacent wafers is approximately 0.6 cm. The gap 234 between the end wafers and the end walls 236 is approximately 2.5 cm. The gap between the wafers 40 and the trough's side walls 232 at their closest approach is approximately 2.5 cm. The side walls 232 extend about 2.5 cm above the highest point of the wafers 40. The end walls 236 can extend beyond the side walls 232 by 2 cm or more, although all that is required is that the end walls 236 extend beyond the side walls 232 sufficiently to limit the rinse fluid flow over the end walls 236. Perforations 237 through the bottom 231 of the trough can be approximately 0.1 inch in diameter, and are sufficient in number and distribution to allow approximately 1 cm/second rinse fluid velocity. The bottom 231 of the trough is semicircular to closely conform to the perimeter shape of the wafers 40, and can be spaced about 2.5 cm from the bottom rim of the wafers 40.

The particular sizes and equipment discussed above are cited merely to illustrate a particular embodiment of the invention. It is contemplated that the use of the invention may involve components having different sizes and characteristics as long as the principle, the development of uniform high fluid flow over the surfaces to be rinsed, is followed. It is intended that the scope of the invention be defined by the claims appended hereto.

We claim:

1. A trough for rinsing one or more planar items having substantially the same shape and size comprising:

a) side and bottom walls of the trough adjacent the lower portions of the items conforming to the lower perimeter shape of the items at an approximately constant distance normal thereto;

b) parallel end walls of the trough that extend beyond the side walls so that rinsing fluid will preferentially flow out over the side walls;

c) means for holding the items in the trough parallel to the end walls; and d) means for allowing the rinsing fluid into the trough.

2. The trough of claim 1 wherein the means for allowing comprises means to direct the rinsing fluid substantially normal to the lower edges of the items.

3. The trough of claim 1 wherein the means for allowing comprises a plurality of perforations through the bottom walls.

4. The trough of claim 1 wherein the means for allowing comprises a plurality of perforations through the side walls.

5. A trough for rinsing a plurality of planar items having substantially the same size and shape comprising:

a) parallel end walls of the trough;

b) side and bottom walls of the trough adjacent the lower portions of the items conforming to the perimeter shape of the items at an approximately constant distance normal thereto;

c) means for holding the items in the trough in a regular array, each item being parallel to the end walls, adjacent items being separated by a first distance, the items at the ends of the array being separated from the adjacent end wall by a second distance less than the first distance; and d) means for allowing the rinsing fluid into the trough.

6. A trough for rinsing a plurality of planar items having substantially the same size and shape comprising:

a) side and bottom walls of the trough adjacent the lower portions of the items conforming to the perimeter shape of the items at an approximately normal distance thereto;

b) parallel end walls of the trough that extend beyond the side walls so that rinsing fluid will preferentially flow out over the side walls;

c) means for holding the items in the trough in a regular array, each item being parallel to the end walls, adjacent items being separated by a first distance, the items at the ends of the array being separated from the adjacent end wall by a second distance less than the first distance; and d) means for allowing the rinsing fluid into the trough.

7. The trough of claim 6 wherein the means for allowing comprises means to direct the rinsing fluid normal to the lower edges of the items.

8. The trough of claim 6 wherein the means for allowing comprises a plurality of perforations through the bottom walls.

9. The trough of claim 6 wherein the means for allowing comprises a plurality of perforations through the side walls.

10. A tank for fluid rinsing of one or more disks comprising:

a) a body whose cross section has an elliptical bottom and terminates in first and second upper edges, said body extending along an axis;

b) first and second end walls attached to said body and extending beyond said upper edges so that fluid will preferentially flow over said upper terminal edges;

c) means for introducing fluid through the body into the tank;

d) means for holding the disks in the tank at an angle to said axis.

11. The apparatus of claim 10 wherein said means for holding the disks further comprises means for holding the disks so that their lower edge is separated from the body by a distance less than 20% of the disk diameter.

12. The apparatus of claim 11 wherein said means for holding the disks further comprises means for holding the disks so that the separation between adjacent disks is substantially the same, and so that the separation between the disk closest to an endwall and the endwall is different than the separation between adjacent disks.

13. The apparatus of claim 10 wherein said means for introducing fluid further comprises means for imparting velocity to the fluid, said velocity directed radially inward over the disks.

14. A trough for rinsing one or more planar items comprising:

a) end walls of the trough;

b) side and bottom walls of the trough;

c) means for holding the items in the trough in an array, where the items at the end of the array are separated from the end walls by a first distance, and where the distance between adjacent items is greater than said first distance; and d) means for introducing rinsing fluid into the trough.

15. The trough of claim 14 wherein the items are separated from the side walls by a second distance, and where the distance between adjacent items is greater than said second distance.

* * * * *